United States Patent
Ransom

(10) Patent No.: US 12,034,462 B2
(45) Date of Patent: Jul. 9, 2024

(54) COMPRESSING PROBABILITY TABLES FOR ENTROPY CODING

(71) Applicant: Synaptics Incorporated, San Jose, CA (US)

(72) Inventor: Scott Liam Ransom, Cambridge (GB)

(73) Assignee: Synaptics Incorporated, San Jose, CA (US)

(*) Notice: Subject to any disclaimer, the term of this patent is extended or adjusted under 35 U.S.C. 154(b) by 158 days.

(21) Appl. No.: 17/818,533

(22) Filed: Aug. 9, 2022

(65) Prior Publication Data
US 2024/0056097 A1  Feb. 15, 2024

(51) Int. Cl.
*H03M 7/30* (2006.01)
*H03M 7/40* (2006.01)
*H03M 7/28* (2006.01)

(52) U.S. Cl.
CPC ............ *H03M 7/40* (2013.01); *H03M 7/28* (2013.01); *H03M 7/30* (2013.01); *H03M 7/6058* (2013.01)

(58) Field of Classification Search
CPC ........ H03M 7/40; H03M 7/30; H03M 7/6058; H03M 7/28
See application file for complete search history.

(56) References Cited

U.S. PATENT DOCUMENTS

| 2005/0084014 A1 | 4/2005 | Wang et al. |
| 2017/0250707 A1 | 8/2017 | Willner et al. |
| 2022/0060196 A1* | 2/2022 | Chang ................. H03M 7/6058 |

OTHER PUBLICATIONS

Combined Search and Examination Report from Application No. GB2312047.0, dated Jan. 24, 2024, pp. 1-5.
R. L. Joshi et al., "Comparison of Different Methods of Classification in Subband Coding of Images," in IEEE Transactions on Image Processing, vol. 6, No. 11, pp. 1473-1486, Nov. 1997, doi: 10.1109/83.641409.

* cited by examiner

Primary Examiner — Joseph J Lauture
(74) Attorney, Agent, or Firm — Paradice & Li LLP

(57) ABSTRACT

This disclosure provides methods, devices, and systems for data compression. The present implementations more specifically relate to encoding techniques for compressing probability tables used for entropy coding. In some aspects, an entropy encoder may encode a probability table so that one or more contexts are represented by fewer bits than would otherwise be needed to represent the frequency of each symbol as a proportion of the total frequency of all symbols associated with such contexts. For example, if a given row of the probability table (prior to encoding) includes a number (M) of entries each having a binary value represented by a number (K) of bits, the same row of entries may be represented by fewer than M*K bits in the encoded probability table.

20 Claims, 11 Drawing Sheets

COMPRESSING PROBABILITY TABLES FOR ENTROPY CODING

TECHNICAL FIELD

The present implementations relate generally to data compression, and specifically to compressing probability tables for entropy coding.

BACKGROUND OF RELATED ART

Data compression is a technique for encoding information into (generally) smaller units of data. As such, data compression can be used to reduce the bandwidth or overhead needed to store or transmit such information over a communications channel (such as a wired or wireless medium). For example, an encoder encodes or compresses the information into a sequence of coded bits (also referred to as a "codeword") and a decoder subsequently decodes or decompresses the codeword to recover the original information. Data compression techniques can be generally categorized as "lossy" or "lossless." Lossy data compression may result in some loss of information between the encoding and decoding of such information. In contrast, no information is lost as a result of encoding or decoding such information using lossless data compression.

Entropy coding is a form of lossless data compression that encodes data values (or "symbols") into codewords of varying lengths based on the probability of occurrence of each symbol. For example, data symbols that have a higher probability of occurrence may be encoded into shorter codewords than data symbols that have a lower probability of occurrence. Many entropy coding techniques (such as arithmetic coding or asymmetric numeral systems) rely on probability tables to encode and decode data symbols. A probability table describes the probability distributions of one or more sets of data symbols associated with a given entropy coding scheme. Thus, an entropy encoder may need to transmit one or more probability tables, along with the encoded data, to an entropy decoder.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter of this disclosure can be implemented in a method performed by an encoder. The method includes steps of encoding a plurality of data symbols as a plurality of codewords, respectively, based on an entropy coding scheme associated with a probability table that includes a number (M) of entries each having a binary value indicating a frequency of a respective symbol associated with a first context, the binary value of each of the M entries being represented by a number (K) of bits; encoding the probability table so that the M entries are represented by fewer than M*K bits in the encoded probability table; and transmitting the plurality of codewords and the encoded probability table to a decoder.

Another innovative aspect of the subject matter of this disclosure can be implemented in an encoder that includes a processing system and a memory. The memory stores instructions that, when executed by the processing system, cause the encoder to encode a plurality of data symbols as a plurality of codewords, respectively, based on an entropy coding scheme associated with a probability table that includes a number (M) of entries each having a binary value indicating a frequency of a respective symbol associated with a first context, the binary value of each of the M entries being represented by a number (K) of bits; encode the probability table so that the M entries are represented by fewer than M*K bits in the encoded probability table; and transmit the plurality of codewords and the encoded probability table to a decoder.

BRIEF DESCRIPTION OF THE DRAWINGS

The present implementations are illustrated by way of example and are not intended to be limited by the figures of the accompanying drawings.

DETAILED DESCRIPTION

Figure 1:
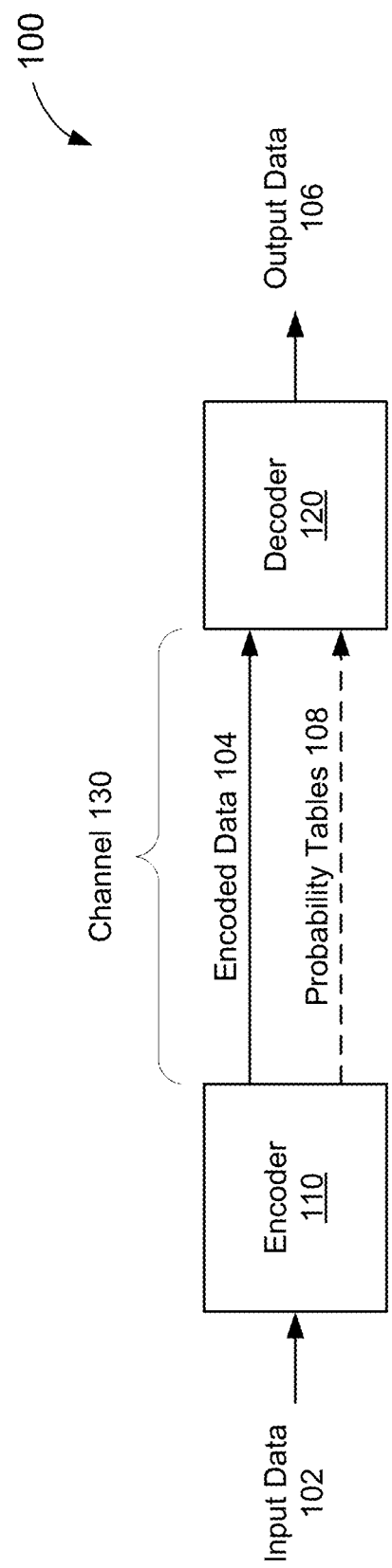
FIG. 1 shows an example communication system for encoding and decoding data.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium including instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random-access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors (or a processing system). The term "processor," as used herein may refer to any general-purpose processor, special-purpose processor, conventional processor, controller, microcontroller, and/or state machine capable of executing scripts or instructions of one or more software programs stored in memory.

As described above, many entropy coding techniques (such as arithmetic coding or asymmetric numeral systems) rely on probability tables to encode and decode data symbols. Each row of a probability table indicates a probability distribution of a respective subset of symbols (also referred to as a "context"). More specifically, each entry in a given row of the probability table indicates a frequency of a respective symbol associated with the corresponding context. Thus, the sum of all entries in the row indicates the total frequency of all symbols associated with a particular context. The transmission of probability tables from an encoder to a decoder consumes some of the available channel bandwidth, which can create a bottleneck in resource-constrained environments or otherwise limit the throughput of data communications. Aspects of the present disclosure recognize that the bandwidth requirements of an entropy coding system can be relaxed through compression of the probability tables.

Various aspects relate generally to data compression, and more particularly, to encoding techniques for compressing probability tables used for entropy coding. In some aspects, an entropy encoder may encode a probability table so that one or more contexts are represented by fewer bits than would otherwise be needed to represent the frequency of each symbol as a proportion of the total frequency of all symbols associated with such contexts. For example, if a given row of the probability table (prior to encoding) includes a number (M) of entries each having a binary value represented by a number (K) of bits, the same row of entries may be represented by fewer than M*K bits in the encoded probability table. In some implementations, the entropy encoder may refrain from encoding any of the entries in a given row if none of the symbols associated the context match any of the data symbols to be entropy encoded. In some other implementations, the entropy encoder may stop encoding individual entries within a row when the remaining (unencoded) entries can be determined from the entries that are already encoded. Still further, in some implementations, the entropy encoder may dynamically reduce the number of bits used to encode successive entries within a row based on the maximum possible value of the entry to be encoded.

Particular implementations of the subject matter described in this disclosure can be implemented to realize one or more of the following potential advantages. The encoding techniques of the present disclosure can be used to reduce the sizes of probability tables, without any loss of information needed for decoding, allowing more probability tables (or data) to be transmitted over a bandwidth-limited channel. For example, aspects of the present disclosure recognize that some probability tables may include probability distributions for one or more contexts that are not relevant (or otherwise unused) for encoding a given dataset. As such, the entries associated with any unused contexts need to be transmitted to the decoder. Aspects of the present disclosure also recognize that the total frequency of all data symbols associated with any given context are known to both the encoder and the decoder. As such, the values of at least some of the entries in each row can be determined from the values of the remaining entries in the row. Further, aspects of the present disclosure recognize that the maximum possible value of each remaining entry within a given row decreases as individual entries within the row are successively encoded. As such, the total number of bits needed to represent such entries also may be reduced.

FIG. 1 shows an example communication system 100 for encoding and decoding data. The communication system 100 includes an encoder 110 and a decoder 120. The encoder 110 and the decoder 120 may be provided in respective communication devices such as, for example, computers, switches, routers, hubs, gateways, cameras, displays, or other devices capable of transmitting or receiving communication signals.

The encoder 110 receives input data 102 to be transmitted or stored via a channel 130. For example, the channel 130 may include a wired or wireless transmission medium that facilities communications between the encoder 110 and the decoder 120. Alternatively, or in addition, the channel 130 may include a data storage medium. In some aspects, the encoder 110 may be configured to compress the size of the input data 102 to accommodate the bandwidth, storage, or other resource limitations associated with the channel 130. For example, the encoder 110 may encode each unit of input data 102 as a respective "codeword" that can be transmitted or stored over the channel 130 (as encoded data 104). The decoder 120 is configured to receive the encoded data 104 via the channel 130 and decode the encoded data 104 as output data 106. For example, the decoder 120 may decompress or otherwise reverse the compression performed by the encoder 110 so that the output data 106 is substantially similar, if not identical, to the original input data 102.

Data compression techniques can be generally categorized as "lossy" or "lossless." Lossy data compression may result in some loss of information between the encoding and decoding steps. As such, the output data 106 may be different than the input data 102. In contrast, lossless data compression does not result in any loss of information between the encoding and decoding steps as long as the channel 130 does not introduce errors into the encoded data 104. As a result of lossless compression, the output data 106 is identical to the input data 102. Entropy encoding is a form of lossless data compression that encodes data values (or "symbols") into codewords of varying lengths based on the probability of occurrence of each data symbol. For example, data symbols that have a higher probability of occurrence may be encoded into shorter codewords than data symbols that have a lower probability of occurrence. Example entropy encoding techniques including, among other examples, arithmetic coding, Huffman coding, and Golomb coding.

Many entropy coding techniques (such as arithmetic coding or asymmetric numeral systems) rely on probability tables to encode and decode data symbols. Each row of a probability table indicates a probability distribution of a respective subset of symbols (also referred to as a "context"). More specifically, each entry in a given row of the probability table indicates a frequency of a respective symbol associated with the corresponding context. Thus, the sum of all entries in the row indicates the total frequency of all symbols associated with a particular context. In some aspects, the encoder 110 may transmit or store one or more probably tables 108 associated with the encoded data 104 via the channel 130. The probability tables 108 indicate the probability distributions of the encoded data symbols and may be used by the decoder 120 to recover the output data 106 from the encoded data 104.

Figure 2:
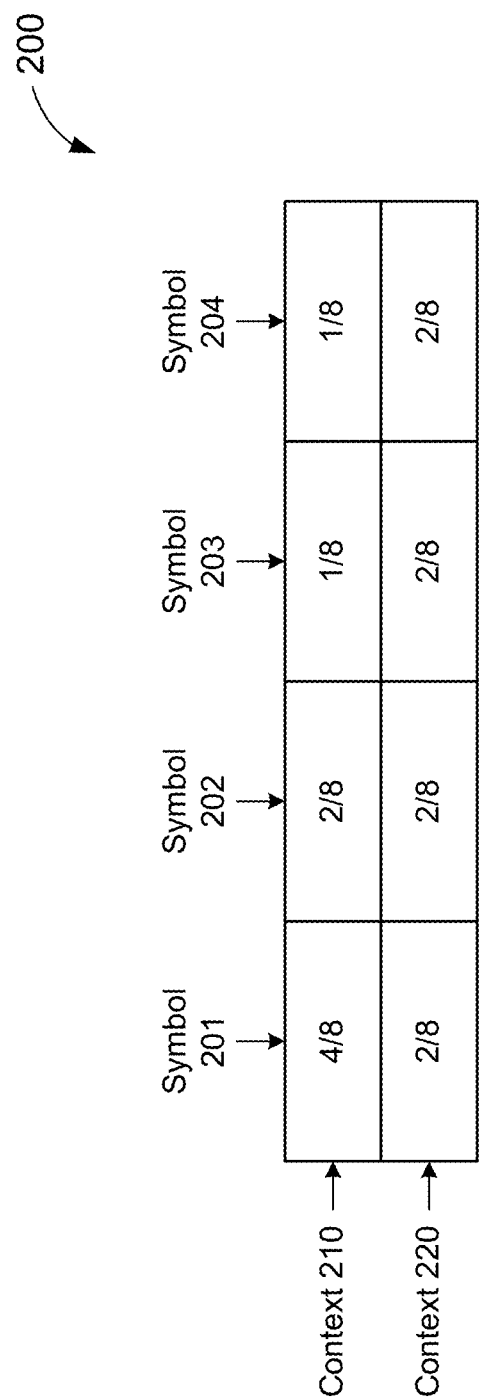
FIG. 2 shows an example probability table associated with an entropy coding scheme.

FIG. 2 shows an example probability table 200 associated with an entropy coding scheme. The probability table 200 includes a number of entries arranged in rows and columns. More specifically, each row of the probability table 200 represents a respective context and each column of the probability table 200 represents a respective symbol. For simplicity, only two contexts 210 and 220 and four symbols 201-204 of the probability table 200 are depicted in FIG. 2. However, the probability table 200 may include any number of contexts and any number of symbols associated with each context.

The entries in each row of the probability table 200 indicate a probability distribution of the symbols 201-204 associated with a respective context 210 or 220. For example, the entries in the first (or top) row of the probability table 200 indicate a probability distribution of the symbols 201-204 associated with the first context 210. In the example of FIG. 2, the first symbol 201 associated with the first context 210 is shown to occur with a probability equal to $4/8$; the second symbol 202 associated with the first context 210 is shown to occur with a probability equal to $2/8$; the third symbol 203 associated with the first context 210 is shown to occur with a probability equal to $1/8$; and the fourth symbol 204 associated with the first context 210 is shown to occur with a probability equal to $1/8$.

The entries in the second (or bottom) row of the probability table 200 indicate probability distribution of the symbols 201-204 associated with the second context 220. In the example of FIG. 2, the first symbol 201 associated with the second context 220 is shown to occur with a probability equal to $2/8$; the second symbol 202 associated with the second context 220 is shown to occur with a probability equal to $2/8$; the third symbol 203 associated with the second context 220 is shown to occur with a probability equal to $2/8$; and the fourth symbol 204 associated with the second context 220 is shown to occur with a probability equal to $2/8$. The entries in each row of the probability table 200 have a total probability of occurrence equal to 1.

As shown in FIG. 2, each entry in the probability table 200 is a proportion (or probability value) defined by a numerator and a denominator. The numerator represents the frequency of a respective symbol associated with a given context and the denominator represents the total frequency of all symbols associated with the context. Thus, entries in the same row of the probability table 200 have the same denominator. In some implementations, the denominator associated with each row (or context) of the probability table 200 may be known to an entropy encoder (such as the encoder 110 of FIG. 1) and to an entropy decoder (such as the decoder 120 of FIG. 1). As such, the entropy encoder may transmit only the frequency values (or numerators) associated with each entry of the probability table 200 to the entropy decoder.

As described above, the transmission of the probability table 200 from the encoder to the decoder consumes some of the available channel bandwidth, which can create a bottleneck in resource-constrained environments or otherwise limit the throughput of data communications. However, aspects of the present disclosure recognize that the bandwidth requirements of an entropy coding system can be relaxed through compression of the probability table 200. In some aspects, the entropy encoder may compress the probability table 200 based on one or more properties that are known to both the encoder and the decoder. For example, aspects of the present disclosure recognize that some probability tables may include one or more contexts that are not used for encoding or decoding a given dataset. With reference for example to FIG. 1, the input data 102 may not contain any data symbols matching any of the symbols 201-204 associated with the second context 220. As such, the second context 220 may be referred to as an "unused context."

Aspects of the present disclosure also recognize that if a context is used for encoding or decoding a given dataset, each of the symbols associated with the context must have a frequency greater than or equal to a minimum frequency (x), where x is known to an entropy encoder (such as the encoder 110 of FIG. 1) and to an entropy decoder (such as the decoder 120 of FIG. 1). In other words, if the input data 102 contains one or more data symbols matching one or more of the symbols 201-204 associated with the first context 210, each of the symbols 201-204 associated with the first context 210 must have a frequency greater than or equal to x. Aspects of the present disclosure further recognize that the highest probability that can be assigned to any symbol associated within a given context depends on the probabilities assigned to the other symbols associated with the same context. For example, because the first symbol 201 associated with the first context 210 has a probability equal to ⅘, each of the remaining symbols 202-204 associated with the first context must have a probability less than or equal to ⅘.

Figure 3:
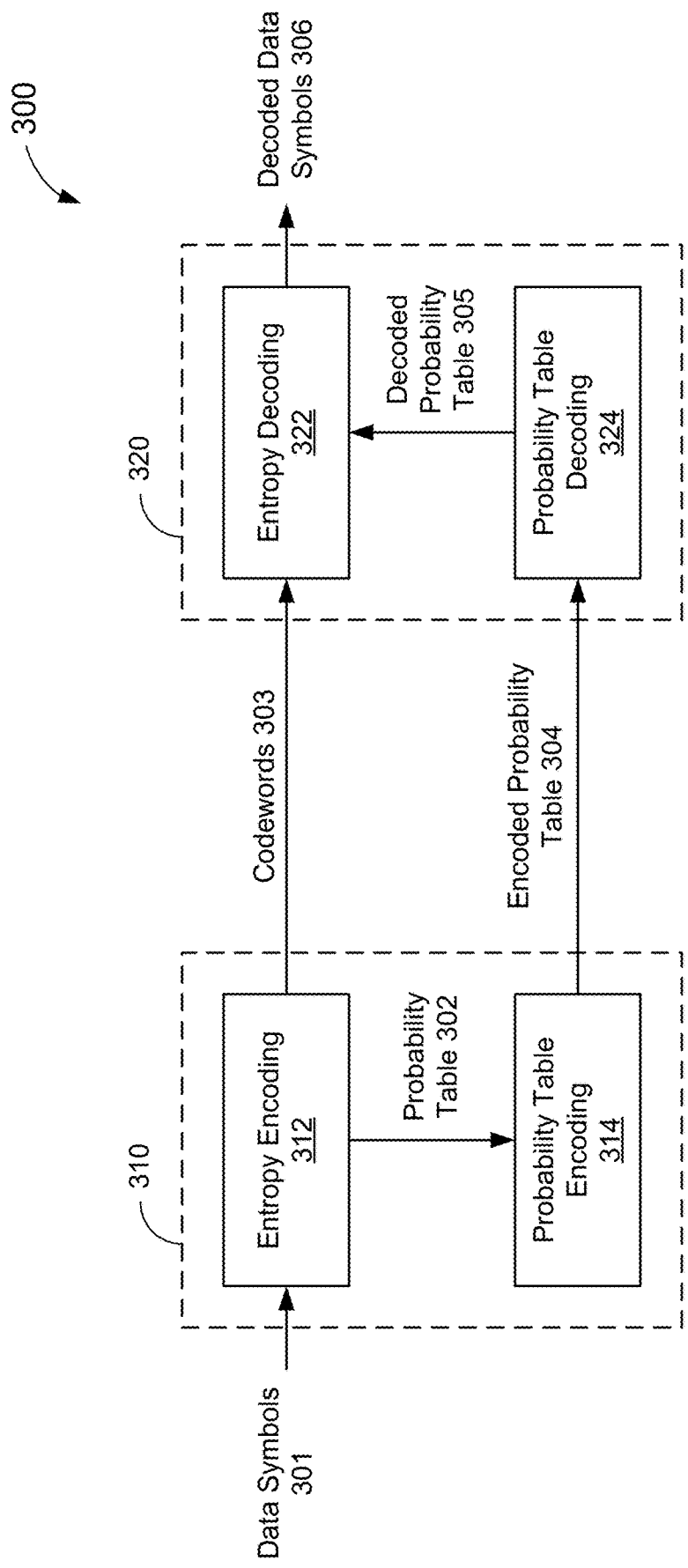
FIG. 3 shows a block diagram of an example entropy coding system, according to some implementations.

FIG. 3 shows a block diagram of an example entropy coding system 300, according to some implementations. The entropy coding system 300 includes an encoder 310 and a decoder 320. In some implementations, the encoder 310 and the decoder 320 may be examples of the encoder 110 and the decoder 120, respectively, of FIG. 1. Thus, the encoder 310 may be communicatively coupled to the decoder 320 via a channel (such as the channel 130 of FIG. 1).

The encoder 310 is configured to encode data symbols 301 for transmission, as codewords 303, to the decoder 320. In some aspects, the encoder 310 may encode the data symbols 301 in accordance with one or more entropy coding techniques. Example suitable entropy coding techniques include arithmetic coding and asymmetric numeral systems, among other examples. Thus, the length of each codeword 303 may vary depending on the frequency (or probability of occurrence) of the respective data symbol 301 in a given dataset. The decoder 320 is configured to decode the codewords 303 to recover decoded data symbols 306. More specifically, the decoder 320 is configured to reverse the encoding performed by the encoder 310 so that the decoded data symbols 306 are substantially similar, if not identical, to the original data symbols 301.

In some implementations, the encoder 310 may include an entropy encoding component 312 and a probability table encoding component 314. The entropy encoding component 312 is configured to compress the data symbols 301 to reduce the size of data transmissions from the encoder 310 to the decoder 320. In some aspects, the entropy encoding component 312 may encode the data symbols 301 as respective codewords 303 based on an entropy coding scheme associated with a probability table 302. The probability table 302 indicates a probability distribution of the data symbols 301. In some implementations, the probability table 302 may be one example of the probability table 200. Thus, the probability table 302 may include a number of entries each indicating a frequency (or probability) of a respective symbol associated with a given context.

The probability table encoding component 314 is configured to encode the probability table 302, as an encoded probability table 304, for transmission to the decoder 320. For example, the probability table encoding component 314 may encode one or more entries of the probability table 302 as binary values that can be represented by a sequence of bits. In some aspects, the probability table encoding component 314 may compress the probability table 302 so that one or more contexts are represented by fewer bits than would otherwise be needed to represent the frequency of each symbol as a proportion of the total frequency of all symbols associated with such contexts. For example, if a given row of the probability table 302 includes a number (M) of entries each having a binary value represented by a number (K) of bits, the same row of entries may be represented by fewer than M*K bits in the encoded probability table 304.

In some implementations, the probability table encoding component 314 may refrain from encoding a given row (or context) of the probability table 302 if none of the symbols associated with the context match any of the data symbols 301 encoded by the entropy encoding component 312. In some other implementations, the probability table encoding component 314 may stop encoding individual entries within a given row of the probability table 302 when the remaining (unencoded) entries can be determined from the entries that are already encoded. Still further, in some implementations, the probability table encoding component 314 may dynamically reduce the number of bits used to encode successive entries within a given row of the probability table 302 based on the maximum possible value of the entry to be encoded.

In some implementations, the decoder 320 may include an entropy decoding component 322 and a probability table decoding component 324. The entropy decoding component 322 is configured to decode the codewords 303 as the decoded data symbols 306. More specifically, the entropy decoding component 322 may reverse the compression performed by the entropy encoding component 312. In some aspects, the entropy decoding component 322 may implement the same entropy coding scheme as the entropy encoding component 312. As such, the entropy decoding component 322 may need to know the probability distribution of the data symbols 301. In some implementations, the entropy decoding component 322 may determine the probability distribution of the data symbols 301 based at least in part on the encoded probability table 304 received from the entropy encoder 310.

The probability table decoding component 324 is configured to decode the encoded probability table 304 to recover a decoded probability table 305. More specifically, the probability table decoding component 324 is configured to reverse the encoding performed by the probability table encoding component 314 so that the decoded probability table 305 is substantially similar, if not identical, to the original probability table 302. In some implementations, the probability table decoding component 324 may determine the values of one or more missing or omitted entries in the encoded probability table 304 based on the values of other entries included in the encoded probability table 304. In some other implementations, the probability table decoding component 324 may interpret the bits associated with one or more entries in the encoded probability table 304 based on the binary values of other entries included in the encoded probability table 304.

Figure 4:
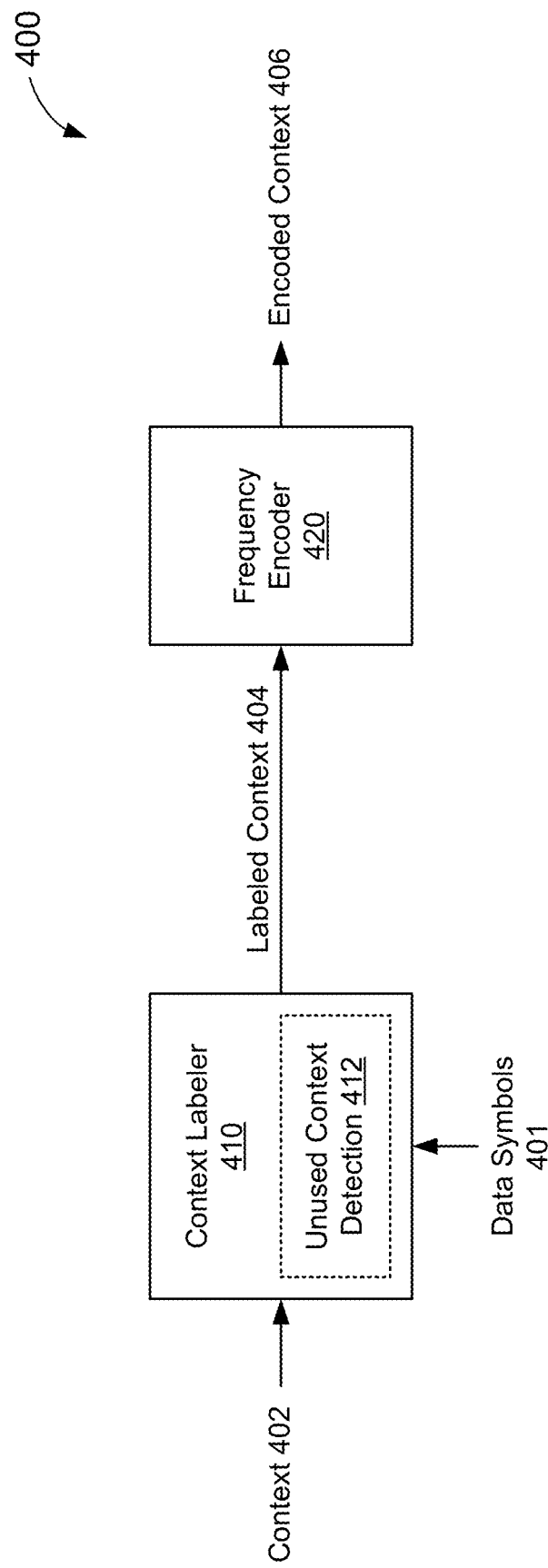
FIG. 4 shows a block diagram of an example probability table encoder, according to some implementations.

FIG. 4 shows a block diagram of an example probability table encoder 400, according to some implementations. The probability table encoder 400 is configured to encode each context 402 associated with a probability table (such as the contexts 210 and 220 of FIG. 2) as a respective encoded context 406. In some implementations, the probability table encoder 400 may be one example of the probability table encoding component 314 of FIG. 3. With reference for example to FIG. 3, the context 402 may represent the nth row of the probability table 302 and the encoded context 406 may represent the nth row of the encoded probability table 304.

In some implementations, the probability table encoder 400 may include a context labeler 410 and a frequency encoder 420. The context labeler 410 is configured to label each context 402 with a respective context indicator indicating whether the context 402 is used (or unused) for encoding a given set of data symbols 401. For example, the context labeler 410 may produce a labeled context 404 by adding or appending the context indicator to the associated context 402. In some aspects, the data symbols 401 may be one example of the data symbols 301 of FIG. 3. In some implementations, the context labeler 410 may include an unused context detection component 412 that compares each of the data symbols 401 to each symbol associated with the given context 402 to determine whether any of the data symbols 401 match any of the symbols associated with the context 402.

If the unused context detection component 412 determines that at least one of the data symbols 401 matches at least one of the symbols associated with the context 402, the context labeler 410 may label the context 402 as "used." For example, the labeled context 404 may include a context indicator (such as a single bit) having a value set to 1 (or 0). On the other hand, if the unused context detection component 412 determines that none of the data symbols 401 match any of the symbols associated with the context 402, the context labeler 410 may label the context 402 as "unused." For example, the labeled context 404 may include a context indicator (such as a single bit) having a value set to 0 (or 1).

The frequency encoder 420 is configured to encode the labeled context 404 as the encoded context 406. In some implementations, the frequency encoder 420 may selectively encode the frequency of each symbol associated with the context 402 based, at least in part, on the context indicator included in the labeled context 404. For example, the frequency encoder 420 may encode the frequency of each symbol associated with the context 402 as a respective binary value if the context indicator indicates that the context 402 is used in the encoding of the data symbols 401. On the other hand, the frequency encoder 402 may refrain from encoding the frequencies of any of the symbols associated with the context 402 if the context indicator indicates that the context 402 is unused. In some implementations, the encoded context 406 may include the context indicator associated with the labeled context 404.

Figure 5:
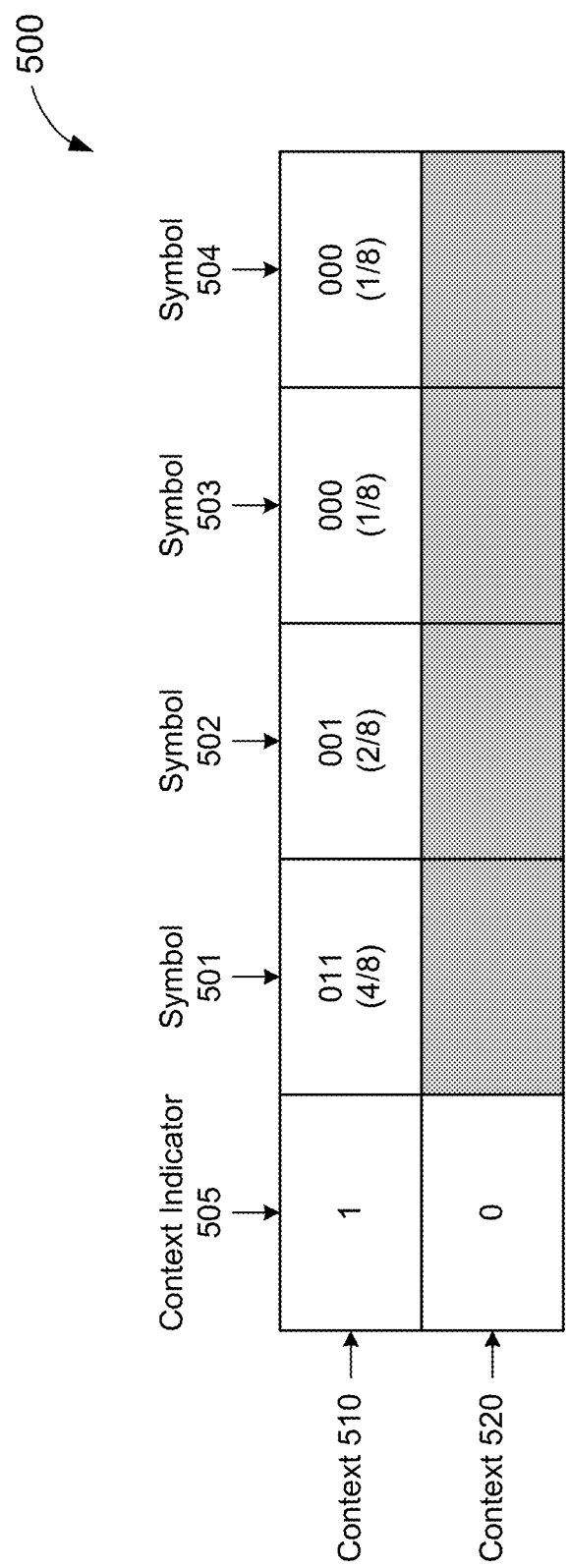
FIG. 5 shows an example encoded probability table, according to some implementations.

FIG. 5 shows an example encoded probability table 500, according to some implementations. Each row of the encoded probability table 500 represents a respective context 510 or 520. The entries in each row of the encoded probability table 500 indicate a probability distribution of a set of symbols 501-504 associated with a respective context 510 or 520.

Within each of the contexts 510 and 520, the symbols 501-504 have a total frequency (y) equal to 8 (y=8), and the minimum frequency (x) that can be assigned to any of the symbols 501-504 is equal to 1 (x=1), where x and y are known to an encoder (such as the encoder 310 of FIG. 3) and to a decoder (such as the decoder 320 of FIG. 3). In some aspects, the minimum frequency (x=1) may be represented by the smallest binary value ("000") that can be encoded in the encoded probability table 500. In some implementations, the encoded probability table 500 may be an encoded representation of the probability table 200 of FIG. 2. With reference for example to FIG. 2, the contexts 510 and 520 may be examples of the contexts 210 and 220, respectively, and the symbols 501-504 may be examples of the symbols 201-204, respectively. In some implementations, the encoded probability table 500 may further include a respective context indicator 505 associated with each of the contexts 510 and 520.

In some implementations, the context indicator 505 may indicate whether each of the contexts 510 or 520 is used for encoding (or decoding) a given set of data symbols (such as any of the data symbols 301 or 401 of FIGS. 3 and 4, respectively). In the example of FIG. 5, a context indicator value of "1" indicates that a respective context is "used" and a context indicator value of "0" indicates that a respective context is "unused." With reference for example to FIG. 4, the context labeler 410 may append the context indicators 505 to the probability table 200 and the frequency encoder 420 may encode the context indicators 505 into the encoded probability table 500. In some implementations, the frequency encoder 420 may further encode the frequency of each symbol associated with a given context only if the context is used. In other words, the frequency encoder 420 may not encode the frequencies of any symbols associated with an unused context.

As shown in FIG. 5, the context indicators 505 indicate that the first context 510 is used for encoding and the second context 520 is unused. Accordingly, the frequency encoder 420 may encode the frequency of each of the symbols 501-504 associated with the first context 510 but may refrain from encoding the frequencies of any of the symbols 501-504 associated with the second context 520. For example, the frequency (4) of the first symbol 501 associated with the first context 510 is encoded as a binary value "011"; the frequency (2) of the second symbol 502 associated with the first context 510 is encoded as a binary value "001"; the frequency (1) of the third symbol 503 associated with the first context 510 is encoded as a binary value "000"; and the frequency (1) of the fourth symbol 504 associated with the first context 510 is encoded as a binary value "000" in the encoded probability table 500. By contrast, the encoded probability table 500 does not include the frequencies of any of the symbols 501-504 associated with the second context 520.

In some aspects, the context indicators 505 may signal to a decoder (such as the decoder 320 of FIG. 3) which of the contexts 510 or 520 have information relevant for decoding the set of data symbols. With reference for example to FIG. 3, the probability table decoding component 324 may determine that the context 510 is used for decoding based on the value (1) of the context indicator 505 associated therewith. As a result, the probability table decoding component 324 may proceed to decode the remaining entries in the first row of the encoded probability table 500 to determine the probability distribution of the symbols 501-504 associated with the first context. The probability table decoding component 324 also may determine that the context 420 is unused based on the value (0) of the context indicator 505 associated therewith. As a result, the probability table decoding component 324 may skip to the next row or context of the probability table 500 (not shown for simplicity).

Figure 6:
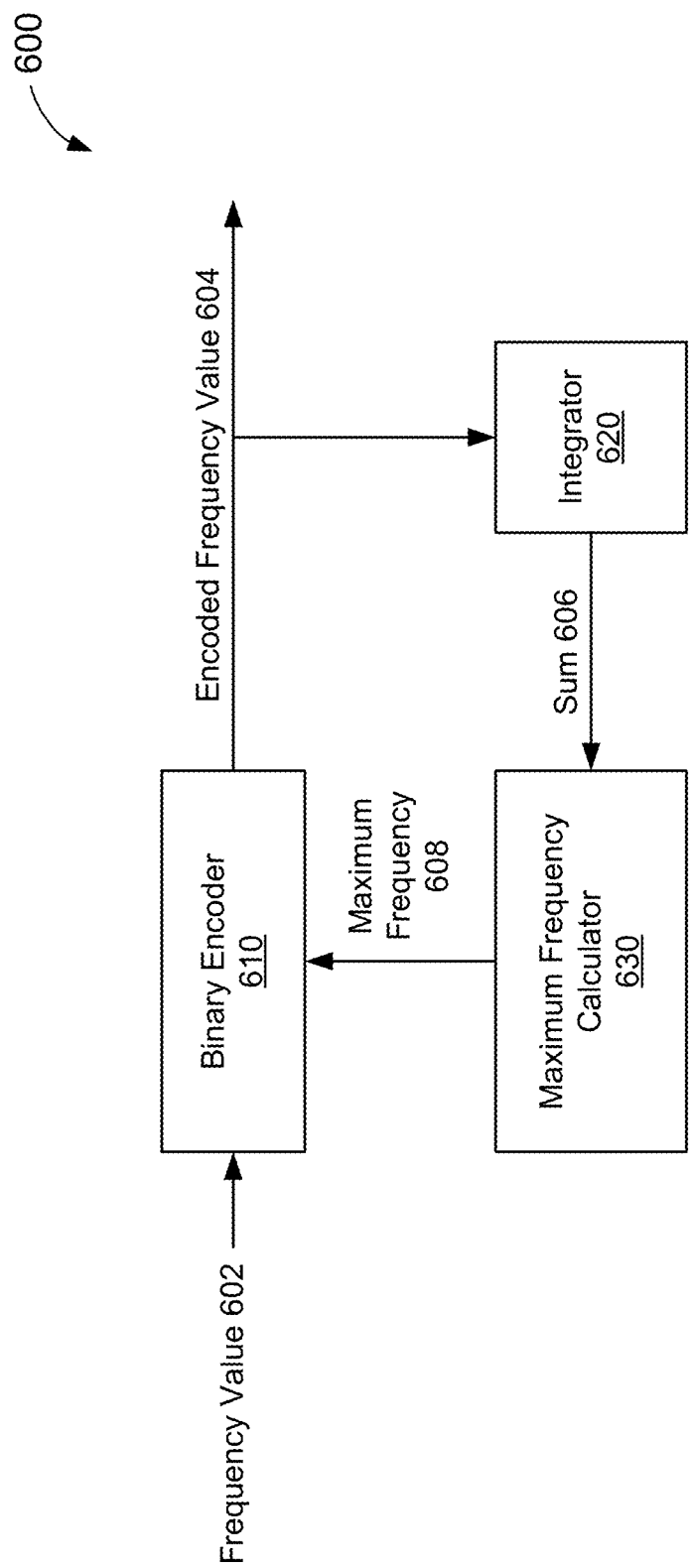
FIG. 6 shows another block diagram of an example probability table encoder, according to some implementations.

FIG. 6 shows another block diagram of an example probability table encoder 600, according to some implementations. The probability table encoder 600 is configured to encode each frequency value 602 associated with a given context of a probability table (such as the contexts 210 and 220 of FIG. 2) as a respective encoded frequency value 604. In some implementations, the probability table encoder 600 may be one example of the probability table encoding component 314 of FIG. 3. With reference for example to FIG. 3, the frequency value 602 may represent an entry in the nth row of the probability table 302 and the encoded frequency value 604 may represent an entry in the nth row of the encoded probability table 304.

In some implementations, the probability table encoder 600 may include a binary encoder 610, an integrator 620, and a maximum frequency calculator 630. The binary encoder 610 is configured to encode each frequency value 602 as a respective encoded frequency value 604 (such as a binary value) spanning a number (N) of bits associated with a maximum frequency 608 that can be assigned to a respective symbol associated with a given context. With reference for example to FIG. 2, the total frequency of the symbols 201-204 associated with the first context 210 is equal to 8 and each of the symbols 201-204 associated with the first context 210 must have a frequency greater than or equal to 1. Thus, the maximum frequency that can be assigned to any of the symbols 201-204 associated with the first context 210 is equal to 5.

Table 1 shows example binary values that can be used to represent any frequency value up to a maximum of 8 (assuming a minimum frequency equal to 1). In the example of Table 1, the smallest binary value ("000") is set to the minimum frequency (1) that can be assigned to any of the symbols associated with a given context. As shown in Table 1, at least 3 bits are needed to encode a binary value equal to 5 ("100"). Thus, at least one of the encoded frequency values 604 associated with the first context 210 may span 3 bits (N=3).

TABLE 1

| Frequency | Binary Value (N = 3) | Binary Value (N = 2) | Binary Value (N = 1) |
|---|---|---|---|
| 1 | 000 | 00 | 0 |
| 2 | 001 | 01 | 1 |
| 3 | 010 | 10 | |
| 4 | 011 | 11 | |
| 5 | 100 | | |
| 6 | 101 | | |
| 7 | 110 | | |
| 8 | 111 | | |

Aspects of the present disclosure recognize that, as frequency values 602 are encoded, the maximum frequency 608 that can be assigned to any of the remaining symbols associated with a given context decreases. With reference for example to FIG. 2, after encoding the frequency (4) of the first symbol 201 associated with the first context 210, the maximum frequency that can be assigned to any of the remaining symbols 202-204 associated with the first context 210 must be less than or equal to 4 (because the total frequency is equal to 8). More generally, the maximum frequency ($f_{max}$) that can be assigned to the $m^{th}$ symbol ($z_m$) to be encoded for a given context can be determined as a function of the total number (M) of symbols associated with the context, the total frequency (y) of the symbols associated with the context, and the minimum frequency (x) that can be assigned to any symbol associated with the context (for $1 \leq m \leq M$), where $f(z_i)$ is the frequency of the $i^{th}$ symbol:

$$f_{max}(z_m) = y - x*(M-m) - \sum_{i=1}^{m-1} f(z_i) \quad (1)$$

The integrator 620 integrates the encoded frequency values 604 associated with a given context to produce a sum 606 of the frequencies already encoded for the context. The maximum frequency calculator 630 is configured to determine the maximum frequency 608 that can be assigned to the current frequency value 602 based on the sum 606 produced by the integrator 620. For example, the maximum frequency calculator 630 may calculate the maximum frequency 608 according to Equation 1, above. In some aspects, the binary encoder 610 may dynamically reduce the number N of bits used to encode each successive frequency value 602 based, at least in part, on the maximum frequency 608.

As shown in Table 1, the frequencies 1-4 are associated with the binary values 000-011, respectively, to support a maximum frequency 608 up to 8. Aspects of the present disclosure recognize that the leading "0" is redundant in each of the binary values 000,001,010, and 011. In other words, the frequencies 1-4 can be uniquely represented by only 2 bits (such as 00, 01, 10, and 11) to support a maximum frequency 608 up to 4. Similarly, the frequencies 1 and 2 can be uniquely represented by only 1 bit (such as 0 and 1) to support a maximum frequency 608 up to 2. In some implementations, the binary encoder 610 may reduce the number N of bits (by 1) when the maximum frequency 608 is halved (such as when the maximum frequency 608 is reduced from 8 to 4 or when the maximum frequency 608 is reduced from 4 to 2). More generally, the number N of bits used to encode the frequency of the $m^{th}$ symbol ($z_m$) associated with a given context can be expressed as:

$$N = \lceil log_2(f_{max}(z_m) - x + 1) \rceil \quad (2)$$

Figure 7:
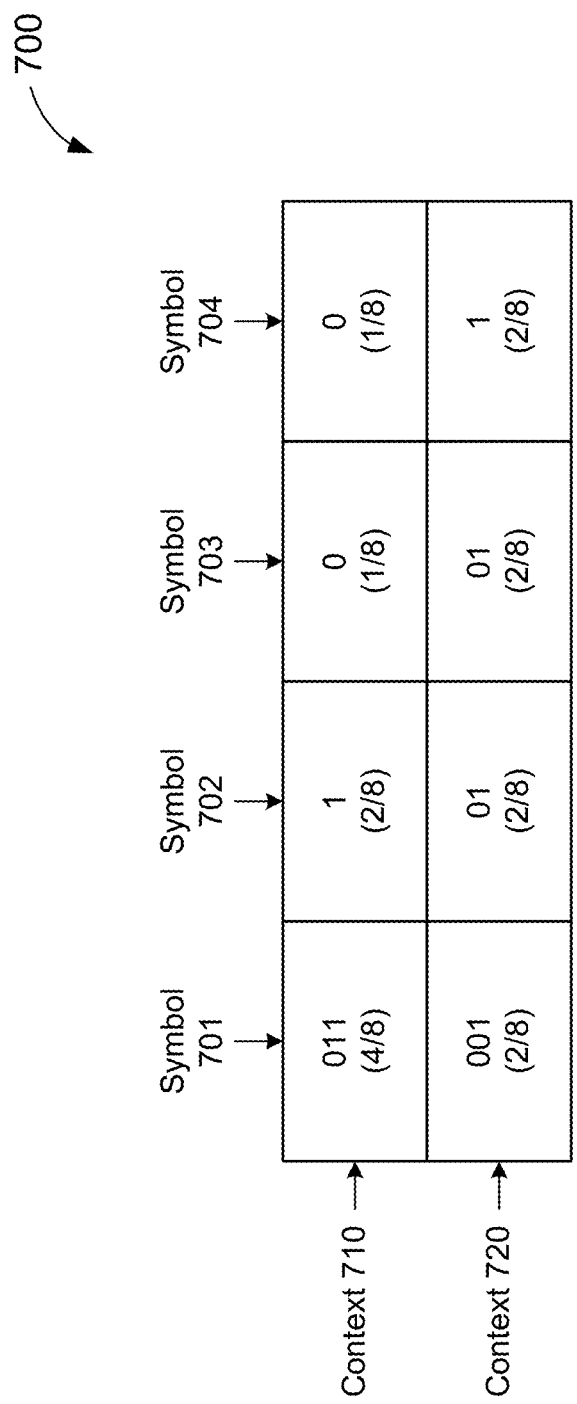
FIG. 7 shows another example encoded probability table, according to some implementations.

FIG. 7 shows another example encoded probability table 700, according to some implementations. The encoded probability table 700 includes a number of entries arranged in rows and columns. The entries in each row of the encoded probability table 700 indicate a probability distribution of a set of symbols 701-704 associated with a respective context 710 or 720.

Within each of the contexts 710 and 720, the symbols 701-704 have a total frequency (y) equal to 8 (y=8), and the minimum frequency (x) that can be assigned to any of the symbols 701-704 is equal to 1 (x=1), where x and y are known to an encoder (such as the encoder 310 of FIG. 3) and to a decoder (such as the decoder 320 of FIG. 3). In some implementations, the encoded probability table 700 may be an encoded representation of the probability table 200 of FIG. 2. With reference for example to FIG. 2, the contexts 710 and 720 may be examples of the contexts 210 and 220, respectively, and the symbols 701-704 may be examples of the symbols 201-204, respectively. As shown in FIG. 7, the frequencies of the symbols 701-704 associated with each of the contexts 710 and 720 are encoded with varying numbers of bits. In some implementations, the encoding may be performed by the probability table encoder 600 of FIG. 6.

With reference for example to FIG. 2, the probability table encoder 600 may initially receive the frequency value (4) of the first symbol 201 associated with the first context 210. Because no frequency values have yet been encoded for the first context 210, the maximum frequency 608 that can be assigned to any of the symbols (201-204) associated with the first context 210 is equal to 5 (because each of the symbols 201-204 must have a frequency greater than or equal to 1 and the sum of these frequencies must be equal to 8). According to Equation 2, above, 3 bits (N=3) are needed to encode the current frequency value (4). With reference for example to Table 1, the probability table encoder 600 may encode the binary value "011" as the frequency of the first symbol 701 associated with the first context 710 in the encoded probability table 700.

The probability table encoder 600 subsequently receives the frequency value (2) of the second symbol 202 associated with the first context 210. At this time, the maximum frequency 608 that can be assigned to any of the remaining symbols (202-204) associated with the first context 210 is equal to 2 (because each of the symbols 202-204 must have a frequency greater than or equal to 1 and the sum of these frequencies must be equal to 4). According to Equation 2, above, only 1 bit (N=1) is needed to encode the current frequency value (2). With reference for example to Table 1, the probability table encoder 600 may encode the binary value "1" as the frequency of the second symbol 702 associated with the first context 710 in the encoded probability table 700.

The probability table encoder 600 subsequently receives the frequency value (1) of the third symbol 203 associated with the first context 210. At this time, the maximum frequency 608 that can be assigned to any of the remaining symbols (203 and 204) associated with the first context 210 is equal to 1 (because each of the symbols 203 and 204 must have a frequency greater than or equal to 1 and the sum of these frequencies must be equal to 2). According to Equation 2, above, no bits (N=0) are needed to encode the current frequency value (1). In some implementations, the probability table encoder 600 may refrain from encoding the frequency of the third symbol 703 associated with the first context 710 (since this frequency is deterministic). In some other implementations, the probability table encoder 600 may encode the frequency of each symbol associated with a given context using at least one bit (such as shown in FIG. 7). With reference for example to Table 1, the probability table encoder 600 may encode the binary value "0" as the frequency of the third symbol 703 associated with the first context 710 in the encoded probability table 700.

The probability table encoder 600 subsequently receives the frequency value (1) of the fourth symbol 204 associated with the first context 210. At this time, the maximum frequency 608 that can be assigned to the last remaining symbol (204) associated with the first context 210 is equal to 1. According to Equation 2, above, no bits (N=0) are needed to encode the current frequency value (1). In some implementations, the probability table encoder 600 may refrain from encoding the frequency of the fourth symbol 704 associated with the first context 710 (since this frequency is deterministic). In some other implementations, the probability table encoder 600 may encode the frequency of each symbol associated with a given context using at least one bit (such as shown in FIG. 7). With reference for example to Table 1, the probability table encoder 600 may encode the binary value "0" as the fourth symbol 704 associated with the first context 710 in the encoded probability table 700.

When encoding the second context 220, the probability table encoder 600 may initially receive the frequency value (2) of the first symbol 201. Because no frequency values have yet been encoded for the second context 220, the maximum frequency 608 that can be assigned to any of the symbols (201-204) associated with the second context 220 is equal to 5 (because each of the symbols 201-204 must have a frequency greater than or equal to 1 and the sum of these frequencies must be equal to 8). According to Equation 2, above, 3 bits (N=3) are needed to encode the current frequency value (2). With reference for example to Table 1, the probability table encoder 600 may encode the binary value "001" as the frequency of the first symbol 701 associated with the second context 720 in the encoded probability table 700.

The probability table encoder 600 subsequently receives the frequency value (2) of the second symbol 202 associated with the second context 220. At this time, the maximum frequency 608 that can be assigned to any of the remaining symbols (202-204) associated with the second context 220 is equal to 4 (because each of the symbols 202-204 must have a frequency greater than or equal to 1 and the sum of these frequencies must be equal to 6). According to Equation 2, above, only 2 bits (N=2) are needed to encode the current frequency value (2). With reference for example to Table 1, the probability table encoder 600 may encode the binary value "01" as the frequency of the second symbol 702 associated with the second context 720 in the encoded probability table 700.

The probability table encoder 600 subsequently receives the frequency value (2) of the third symbol 203 associated with the second context 220. At this time, the maximum frequency 608 that can be assigned to any of the remaining symbols (203 and 204) associated with the second context 220 is equal to 3 (because each of the symbols 201-204 must have a frequency greater than or equal to 1 and the sum of these frequencies must be equal to 4). According to Equation 2, above, 2 bits (N=2) are still needed to encode the current frequency value (2). With reference for example to Table 1, the probability table encoder 600 may encode the binary value "01" as the frequency of the third symbol 703 associated with the second context 720 in the encoded probability table 700.

The probability table encoder 600 subsequently receives the frequency value (2) of the fourth symbol 204 associated with the second context 220. At this time, the maximum frequency 608 that can be assigned to the last remaining symbol (204) associated with the second context 220 is equal to 2. According to Equation 2, above, only 1 bit (N=1) is needed to encode the current frequency value (2). With reference for example to Table 1, the probability table encoder 600 may encode the binary value "1" as the fourth symbol 704 associated with the second context 720 in the encoded probability table 700.

In some aspects, a decoder (such as the decoder 320 of FIG. 3) may decode the symbols 701-704 associated with each of the contexts 710 and 720 in the same order in which they are encoded. As such, the decoder may determine the length (or number N of bits) of each entry in the encoded probability table 700 based on the same or similar process as the probability table encoder 600. For example, the decoder knows that the total frequency of the symbols 701-704 associated with the first context 710 is equal to 8 and the minimum frequency that can be assigned to each symbol 701-704 associated with the first context 710 is equal to 1. As such, the decoder can determine that the maximum frequency that can be assigned to the first symbol 701 associated with the first context 710 is equal to 5. Thus, the frequency of the first symbol 701 must be encoded as the first 3 bits associated with the first context 710.

After recovering the frequency (4) of the first symbol 701, the decoder knows that the maximum frequency that can be assigned to the second symbol 702 is equal to 2 (based on the same calculations as performed by the encoder 600). Thus, the frequency of the second symbol 702 must be encoded using only the following bit associated with the first context 710. The decoder may continue decoding the encoded probability table 700 in this manner until the frequency of each of the symbols 201-204 associated with each of the contexts 210 and 220 has been recovered.

Figure 8:
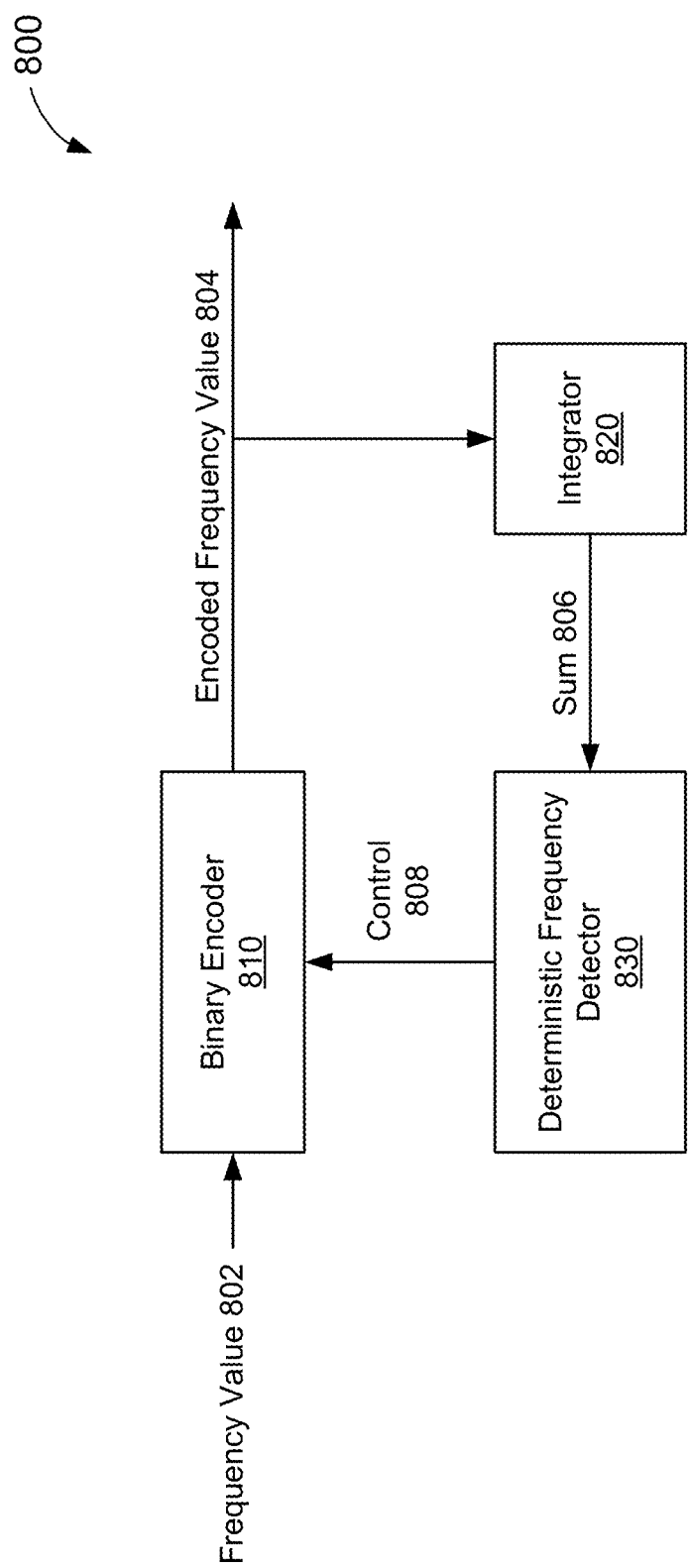
FIG. 8 shows another block diagram of an example probability table encoder, according to some implementations.

FIG. 8 shows another block diagram of an example probability table encoder 800, according to some implementations. The probability table encoder 800 is configured to encode each frequency value 802 associated with a given context of a probability table (such as the contexts 210 and 220 of FIG. 2) as a respective encoded frequency value 804. In some implementations, the probability table encoder 800 may be one example of the probability table encoding component 314 of FIG. 3. With reference for example to FIG. 3, the frequency value 802 may represent an entry in the nth row of the probability table 302 and the encoded frequency value 804 may represent an entry in the nth row of the encoded probability table 304.

In some implementations, the probability table encoder 800 may include a binary encoder 810, an integrator 820, and a deterministic frequency detector 830. The binary encoder 810 is configured to encode each frequency value 802 as a respective encoded frequency value 804 (such as a binary value). Aspects of the present disclosure recognize that, as frequency values 802 are encoded, the range of frequencies that can be assigned to the remaining symbols associated with a given context decreases. With reference for example to FIG. 2, after encoding the frequency (4) of the first symbol 201 associated with the first context 210, the frequencies of the remaining symbols 202-204 must sum to 4 and each of the remaining symbols 202-204 must have a frequency greater than or equal to 1. Thus, at least one of the symbols associated with each context will have a deterministic frequency based, at least in part, on the sum of the frequencies already encoded for the context.

The integrator 820 integrates the encoded frequency values 804 associated with a given context to produce a sum 806 of the frequencies already encoded for the context. The deterministic frequency detector 830 is configured to determine whether the remaining (unencoded) frequency values 802 associated with the current context are deterministic based on the sum 806 produced by the integrator 820. In some implementations, the deterministic frequency detector 830 may determine that the current frequency value 802 is deterministic if the number (L) of remaining symbols associated with the current context multiplied by the minimum frequency (x) that can be assigned to each symbol associated with the context is equal to the remaining frequency that can be allocated for the context (where the remaining frequency is equal to the total frequency associated with the context minus the sum 806 of the frequencies already encoded for the context). In some other implementations, the deterministic frequency detector 830 may determine that the current frequency value 802 is deterministic when there is only one remaining symbol associated with the current context (L=1).

With reference for example to FIG. 2, after encoding the first two symbols 201 and 202 associated with the first context 210, the remaining frequency is equal to 2. Because the number of remaining symbols (L=2) multiplied by the minimum frequency (x=1) that can be assigned to each symbol is equal to the remaining frequency (2) for the first context 210, the last two symbols 203 and 204 associated with the first context 210 have deterministic frequencies. More specifically, each of the symbols 203 and 204 must have a frequency equal to 1. On the other hand, after encoding the first three symbols 201-203 associated with the second context 220, the remaining frequency is equal to 2. Because there is only one remaining symbol associated with the second context 220 (L=1), the remaining symbol 204 must have a frequency equal to 2. Thus, the deterministic frequency detector 830 may determine that the last symbol 204 associated with the second context 220 has a deterministic frequency.

In some aspects, the deterministic frequency detector 830 may control the encoding of frequency values 802 by the binary encoder 810. For example, the deterministic frequency detector 830 may assert (or de-assert) a control signal 808 when the remaining symbols associated with the context are determined to have deterministic frequencies. Upon receiving the asserted (or de-asserted) control signal 808, the binary encoder 810 may refrain from encoding the remaining frequency values 802 associated with the current context. In some implementations, the binary encoder 810 may resume the encoding of frequency values 802 beginning with the first symbol associated with the next context of the probability table.

Figure 9:
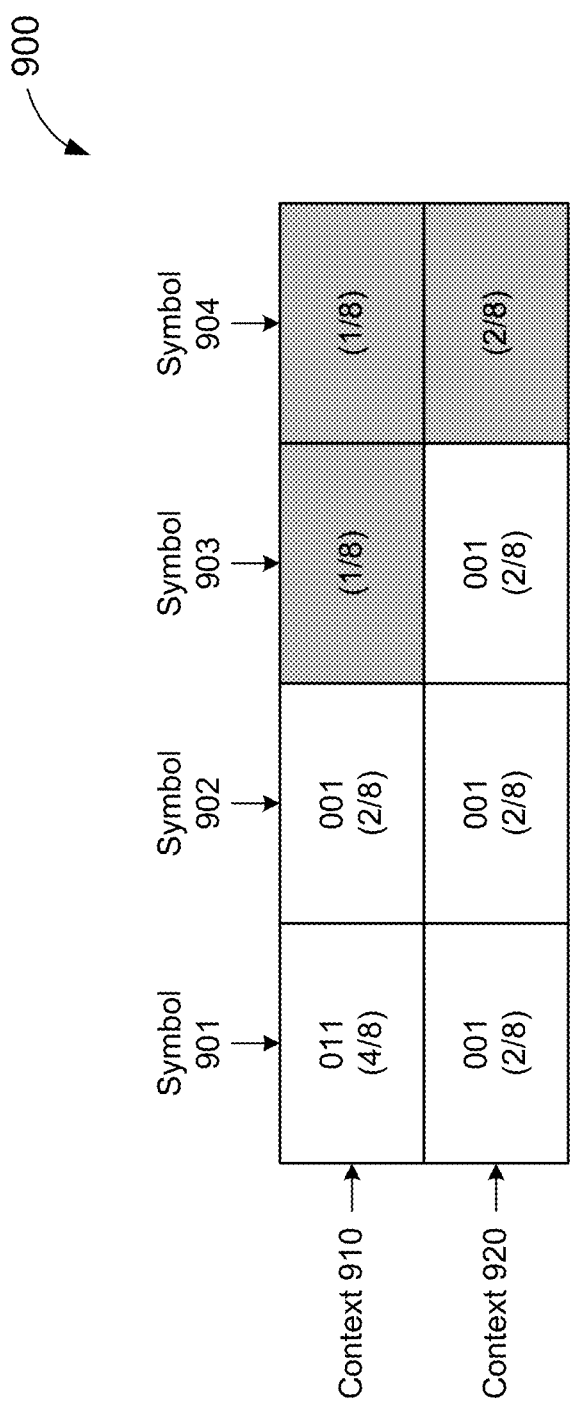
FIG. 9 shows another example encoded probability table, according to some implementations.

FIG. 9 shows another example encoded probability table 900, according to some implementations. The encoded probability table 900 includes a number of entries arranged in rows and columns. The entries in each row of the encoded probability table 900 indicate a probability distribution of a set of symbols 901-904 associated with a respective context 910 or 920.

Within each of the contexts 910 and 920, the symbols 901-904 have a total frequency (y) equal to 8 (y=8), and the minimum frequency (x) that can be assigned to any of the symbols 901-904 is equal to 1 (x=1), where x and y are known to an encoder (such as the encoder 310 of FIG. 3) and to a decoder (such as the decoder 320 of FIG. 3). In some implementations, the encoded probability table 900 may be an encoded representation of the probability table 200 of FIG. 2. With reference for example to FIG. 2, the contexts 910 and 920 may be examples of the contexts 210 and 220, respectively, and the symbols 901-904 may be examples of the contexts 201-204, respectively. As shown in FIG. 9, the frequencies of the third and fourth symbols 903 and 904 associated with the first context 910 are omitted from the encoded probability table 900 and the frequency of the fourth symbol 904 associated with the second context 920 is also omitted from the encoded probability table 900. In some implementations, the encoding may be performed by the probability table encoder 800 of FIG. 8.

With reference for example to FIG. 2, the probability table encoder 800 may initially receive the frequency value (4) of the first symbol 201 associated with the first context 210. Because no frequency values have yet been encoded for the first context 210, the probability table encoder 800 may encode at least the current frequency value (4) in the encoded probability table 900. With reference for example to Table 1, the probability table encoder 800 may encode the binary value "011" as the frequency of the first symbol 901 associated with the first context 910 in the encoded probability table 900.

The probability table encoder 800 subsequently receives the frequency value (2) of the second symbol 202 associated with the first context 210. At this time, there is more than one remaining symbol associated with the first context 210 (L>1) and the total remaining frequency is different than the number of remaining symbols (L≠4). Thus, the probability table encoder 800 also may encode the current frequency value (2) in the encoded probability table 900. With reference for example to Table 1, the probability table encoder 800 may encode the binary value "001" as the frequency of the second symbol 902 associated with the first context 910 in the encoded probability table 900.

The probability table encoder 800 subsequently receives the frequency value (1) of the third symbol 203 associated with the first context 210. At this time, there is still more than one remaining symbol associated with the first context 210 (L>1), but the total remaining frequency is equal to the number of remaining symbols (L=2). Thus, the probability table encoder 800 may not encode the current frequency value (1), or any of the remaining frequency values (such as the frequency of the fourth symbol 904) associated with the first context 910, in the encoded probability table 900. As a result, the frequencies of the third and fourth symbols 903 and 904 associated with the first context 910 are omitted from the encoded probability table 900.

When encoding the second context 220, the probability table encoder 800 may initially receive the frequency value (2) of the first symbol 201. Because no frequency values have yet been encoded for the second context 220, the probability table encoder 800 may encode at least the current frequency value (2) in the encoded probability table 900. With reference for example to Table 1, the probability table encoder 800 may encode the binary value "001" as the frequency of the first symbol 901 associated with the second context 920 in the encoded probability table 900.

The probability table encoder 800 subsequently receives the frequency value (2) of the second symbol 202 associated with the second context 220. At this time, there is more than one remaining symbol associated with the second context 220 (L>1) and the total remaining frequency is different than the number of remaining symbols (L≠6). Thus, the probability table encoder 800 also may encode the current frequency value (2) in the encoded probability table 900. With reference for example to Table 1, the probability table encoder 800 may encode the binary value "001" as the frequency of the second symbol 902 associated with the second context 920 in the encoded probability table 900.

The probability table encoder 800 subsequently receives the frequency value (2) of the third symbol 203 associated with the second context 220. At this time, there is still more than one remaining symbol associated with the second context 220 (L>1) and the total remaining frequency is still different than the number of remaining symbols (L≠4). Thus, the probability table encoder 800 also may encode the current frequency value (2) in the encoded probability table 900. With reference for example to Table 1, the probability table encoder 800 may encode the binary value "001" as the frequency of the third symbol 903 associated with the second context 920 in the encoded probability table 900.

The probability table encoder 800 subsequently receives the frequency value (2) of the fourth symbol 203 associated with the second context 220. At this time, the total remaining frequency is still different than the number of remaining symbols (L≠2), but there is only one remaining symbol associated with the first context 210 (L=1). Thus, the probability table encoder 800 may not encode the current frequency value (2) in the encoded probability table 900. As a result, the frequency of the fourth symbol 904 associated with the second context 920 is omitted from the encoded probability table 900.

In some aspects, a decoder (such as the decoder 320 of FIG. 3) may decode the symbols 901-904 associated with each of the context 910 and 920 in the same order in which they are encoded. As such, the decoder may recover the omitted frequency values in the encoded probability table 900 based on the same or similar process as the probability table encoder 800. For example, the decoder knows that the total frequency associated with each of the contexts 910 and 920 is equal to 8. The decoder also knows that the frequency of any symbol must be greater than or equal to 1.

Thus, after recovering the frequencies of the first two symbols 901 and 902 associated with the first context 910, the decoder knows that each of the remaining symbols 903 and 904 associated with the first context 910 must have a frequency equal to 1. Further, after recovering the frequencies of the first three symbols 901-903 associated with the second context 920, the decoder knows that the last remaining symbol 904 associated with the second context 920 must have a frequency equal to 2.

The example probability table encoders 400, 600, and 800 of FIGS. 4, 6, and 8, respectively, have been described as individual implementations of the probability table encoding component 314 of FIG. 3. However, in actual implementations, the probability table encoding component 314 may implement any combination of the probability table encoders 400, 600, or 800 to achieve greater compression of a probability table. For example, the probability table encoding component 314 may perform the encoding techniques of one or more of the probability table encoders 400, 600, or 800, individually or in combination, to encode the probability table 302 as an encoded probability table 304.

Figure 10:
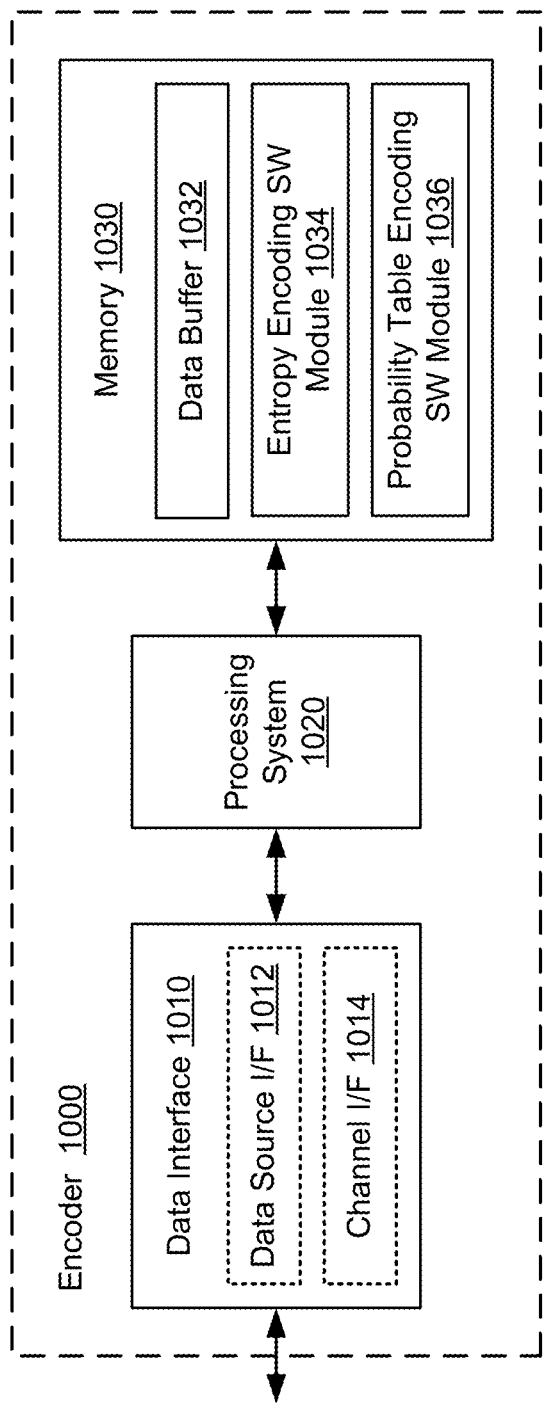
FIG. 10 shows a block diagram of an encoder, according to some implementations.

FIG. 10 shows a block diagram of an encoder 1000, according to some implementations. The encoder 1000 may be one example of any of the encoders 110 or 310 of FIGS. 1 and 3, respectively. More specifically, the encoder 1000 may be configured to encode data symbols in accordance with an entropy coding scheme, and to further compress probability tables associated with the entropy coding scheme, for storage or transmission via a channel (not shown for simplicity).

In some implementations, the encoder 1000 may include a data interface 1010, a processing system 1020, and a memory 1030. The data interface 1010 is configured to receive the data symbols and output encoded codewords, and probability tables, associated with the data symbols. In some aspects, the data interface 1010 may include a data source interface (I/F) 1012 and a channel interface 1014. The data source interface 1012 is configured to communicate with a data source coupled to or otherwise associated with the encoder 1000. The channel interface 1014 is configured to communicate over the channel with a decoder (not shown for simplicity). For example, the channel interface 1014 may transmit the codewords and encoded probability tables, via the channel, to the decoder.

The memory 1030 may include a data buffer 1032 configured to store the data symbols and any intermediate data associated with the encoding operation. The memory 1030 also may include a non-transitory computer-readable medium (including one or more nonvolatile memory elements, such as EPROM, EEPROM, Flash memory, a hard drive, and the like) that may store at least the following software (SW) modules:

an entropy encoding SW module 1034 to encode a plurality of data symbols as a plurality of codewords, respectively, based on an entropy coding scheme associated with a probability table that includes a number (M) of entries each having a binary value indicating a frequency of a respective symbol associated with a first context, where the binary value of each of the M entries is represented by a number (K) of bits; and a probability table encoding SW module 1036 to encode the probability table so that the M entries are represented by fewer than M*K bits in the encoded probability table.

Each software module includes instructions that, when executed by the processing system 1020, causes the encoder 1000 to perform the corresponding functions.

The processing system 1020 may include any suitable one or more processors capable of executing scripts or instructions of one or more software programs stored in the encoder 1000 (such as in memory 1030). For example, the processing system 1020 may execute the entropy encoding SW module 1034 to encode a plurality of data symbols as a plurality of codewords, respectively, based on an entropy coding scheme associated with a probability table that includes a number (M) of entries each having a binary value indicating a frequency of a respective symbol associated with a first context, where the binary value of each of the M entries is represented by a number (K) of bits. The processing system 1020 also may execute the probability table encoding SW module 1036 to encode the probability table so that the M entries are represented by fewer than M*K bits in the encoded probability table.

Figure 11:
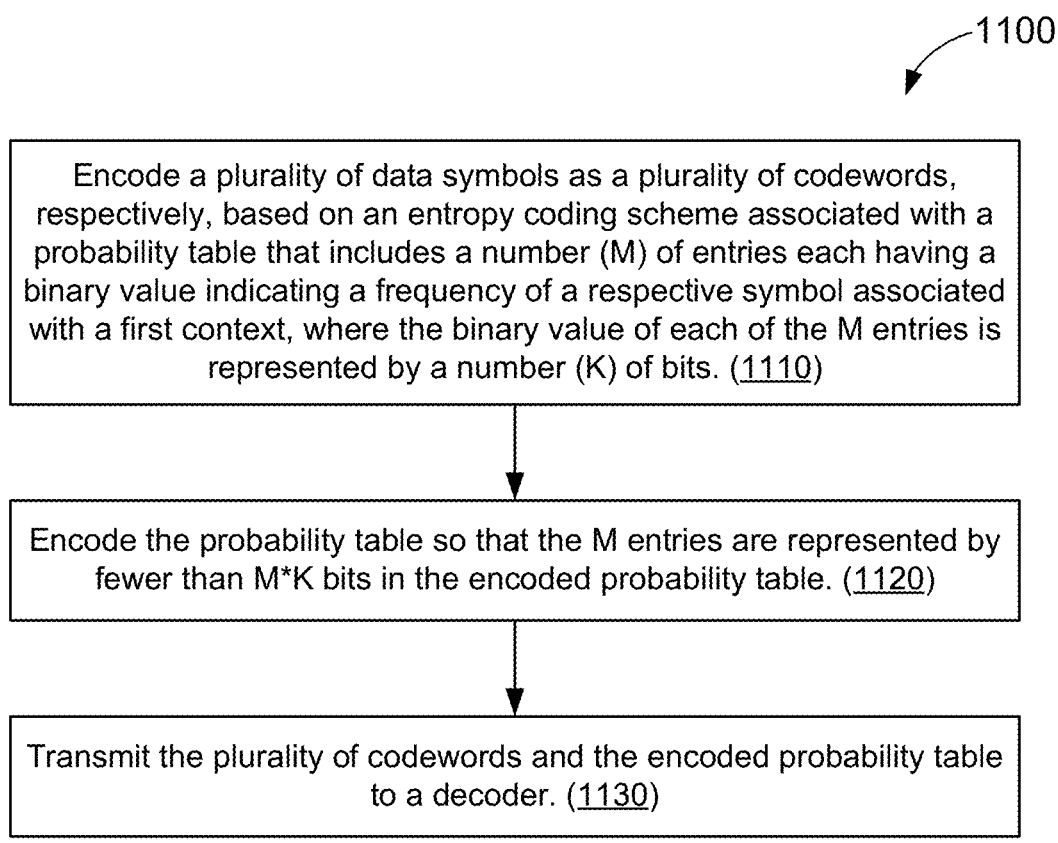
FIG. 11 shows an illustrative flowchart depicting an example operation for data encoding, according to some implementations.

FIG. 11 shows an illustrative flowchart depicting an example operation 1100 for data encoding, according to some implementations. In some implementations, the example operation 1100 may be performed by an encoder such as any of the encoders 110 or 310 of FIGS. 1 and 3, respectively.

The encoder may encode a plurality of data symbols as a plurality of codewords, respectively, based on an entropy coding scheme associated with a probability table that includes a number (M) of entries each having a binary value indicating a frequency of a respective symbol associated with a first context, where the binary value of each of the M entries is represented by a number (K) of bits (1110). The encoder also may encode the probability table so that the M entries are represented by fewer than M*K bits in the encoded probability table (1120). The encoder may further transmit the plurality of codewords and the encoded probability table to a decoder (1130).

In some aspects, the encoded probability table may include a first context indicator indicating that none of the symbols associated with the first context matches any of the plurality of data symbols. In some implementations, the M entries may be omitted from the encoded probability table. In some aspects, the encoded probability table may further include a number (N) of entries each indicating a frequency of a respective symbol associated with a second context. In some implementations, the encoded probability table may further include a second context indicator indicating that one or more of the symbols associated with the second context match one or more of the plurality of data symbols.

In some other aspects, a number (L) of entries of the M entries may be omitted from the encoded probability table and the remaining M−L entries are included in the encoded probability table. In some implementations, the L omitted entries may have deterministic values associated with the M−L entries that are included in the encoded probability table. In some implementations, L may be equal to the difference between the sum of the M entries and the sum of the M−L entries included in the encoded probability table. Still further, in some aspects, a first entry of the M entries may be represented by fewer bits in the encoded probability table than each entry, of the M entries, encoded prior to the first entry. In some implementations, the encoding of the probability table may include dynamically reducing a number of bits used to encode successive entries of the M entries.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method of data encoding, comprising:
    encoding a plurality of data symbols as a plurality of codewords, respectively, based on an entropy coding scheme associated with a probability table that includes a number (M) of entries each having a binary value indicating a frequency of a respective symbol associated with a first context, the binary value of each of the M entries being represented by a number (K) of bits;
    encoding the probability table so that the M entries are represented by fewer than M*K bits in the encoded probability table; and
    transmitting the plurality of codewords and the encoded probability table to a decoder.

2. The method of claim 1, wherein the encoded probability table includes a first context indicator indicating that none of the symbols associated with the first context matches any of the plurality of data symbols.

3. The method of claim 2, wherein the M entries are omitted from the encoded probability table.

4. The method of claim 2, wherein the encoded probability table further includes a number (N) of entries each indicating a frequency of a respective symbol associated with a second context.

5. The method of claim 4, wherein the encoded probability table further includes a second context indicator indicating that one or more of the symbols associated with the second context match one or more of the plurality of data symbols.

6. The method of claim 1, wherein a first entry of the M entries is represented by fewer bits in the encoded probability table than each entry, of the M entries, encoded prior to the first entry.

7. The method of claim 1, wherein a number (L) of entries of the M entries are omitted from the encoded probability table and the remaining M−L entries are included in the encoded probability table.

8. The method of claim 7, wherein the L omitted entries have deterministic values associated with the M−L entries that are included in the encoded probability table.

9. The method of claim 7, wherein L multiplied by a minimum frequency associated with each of the M entries is equal to the difference between the sum of the M entries and the sum of the M−L entries included in the encoded probability table.

10. The method of claim 1, wherein the encoding of the probability table comprises:
dynamically reducing a number of bits used to encode successive entries of the M entries.

11. An encoder comprising:
a processing system; and
a memory storing instructions that, when executed by the processing system, causes the encoder to:
encode a plurality of data symbols as a plurality of codewords, respectively, based on an entropy coding scheme associated with a probability table that includes a number (M) of entries each having a binary value indicating a frequency of a respective symbol associated with a first context, the binary value of each of the M entries being represented by a number (K) of bits;
encode the probability table so that the M entries are represented by fewer than M*K bits in the encoded probability table; and
transmit the plurality of codewords and the encoded probability table to a decoder.

12. The encoder of claim 11, wherein the encoded probability table includes a first context indicator indicating that none of the symbols associated with the first context matches any of the plurality of data symbols.

13. The encoder of claim 12, wherein the M entries are omitted from the encoded probability table.

14. The encoder of claim 12, wherein the encoded probability table includes a number (N) of entries each indicating a frequency of a respective symbol associated with a second context.

15. The encoder of claim 14, wherein the encoded probability table further includes a second context indicator indicating that one or more of the symbols associated with the second context match one or more of the plurality of data symbols.

16. The encoder of claim 11, wherein a first entry of the M entries is represented by fewer bits in the encoded probability table than each entry, of the M entries, encoded prior to the first entry.

17. The encoder of claim 11, wherein a number (L) of entries of the M entries are omitted from the encoded probability table and the remaining M−L entries are included in the encoded probability table.

18. The encoder of claim 17, wherein the L omitted entries have deterministic values associated with the M−L entries that are included in the encoded probability table.

19. The encoder of claim 17, wherein L multiplied by a minimum frequency associated with each of the M entries is equal to the difference between the sum of the M entries and the sum of the M−L entries included in the encoded probability table.

20. The encoder of claim 11, wherein the encoding of the probability table comprises:
dynamically reducing a number of bits used to encode successive entries of the M entries.

\* \* \* \* \*